US011127341B2

(12) United States Patent
Li et al.

(10) Patent No.: US 11,127,341 B2
(45) Date of Patent: Sep. 21, 2021

(54) LIGHT EMITTING MODULE AND DISPLAY DEVICE

(71) Applicant: PlayNitride Inc., Tainan (TW)

(72) Inventors: Yun-Li Li, Tainan (TW); Tzu-Yang Lin, Tainan (TW); Yu-Hung Lai, Tainan (TW); Po-Jen Su, Tainan (TW); Hsuan-Wei Mai, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 16/027,204

(22) Filed: Jul. 3, 2018

(65) Prior Publication Data
US 2019/0012956 A1    Jan. 10, 2019

(30) Foreign Application Priority Data

Jul. 4, 2017    (TW) .................................. 106122336

(51) Int. Cl.
*G09G 3/32*    (2016.01)
*H01L 23/48*    (2006.01)
(Continued)

(52) U.S. Cl.
CPC ............. *G09G 3/32* (2013.01); *H01L 23/481* (2013.01); *H01L 25/0753* (2013.01);
(Continued)

(58) Field of Classification Search
CPC .......... G09G 3/30; G09G 3/32; G09G 3/3208; G09G 3/3216; G09G 3/3225;
(Continued)

(56) References Cited

U.S. PATENT DOCUMENTS 8,890,217 B2 * 11/2014 Su ....................... H01L 23/3677
257/276
10,410,577 B2 * 9/2019 Lai ....................... H01L 25/167
(Continued)

FOREIGN PATENT DOCUMENTS

CN         102104102        6/2011
CN         102169941        8/2011
(Continued)

OTHER PUBLICATIONS

"Office Action of China Counterpart Application", dated Aug. 17, 2020, p. 1-p. 6.
(Continued)

*Primary Examiner* — Alexander Eisen
*Assistant Examiner* — Nelson Lam
(74) *Attorney, Agent, or Firm* — JCIPRNET

(57) ABSTRACT

A light emitting module including a circuit carrier and a plurality of light emitting devices is provided. The circuit carrier includes a first circuit layer, a second circuit layer, a dielectric layer and a plurality of conductive vias. The first circuit layer and the second circuit layer are located at two opposite sides of the dielectric layer. The conductive vias pass through the dielectric layer and two opposite end portions of each of the conductive vias are respectively connected to the first circuit layer and the second circuit layer. The light emitting devices are electrically bonded to the first circuit layer. Moreover, the light emitting devices are disposed in a device disposing area of the circuit carrier and the conductive vias are arranged outside the device disposing area. A display device is also provided.

9 Claims, 7 Drawing Sheets

(51) Int. Cl.
*H01L 25/075* (2006.01)
*F21Y 115/10* (2016.01)
*H01L 33/62* (2010.01)
*H01L 33/52* (2010.01)
*H01L 23/00* (2006.01)

(52) U.S. Cl.
CPC ............ *F21Y 2115/10* (2016.08); *H01L 24/16* (2013.01); *H01L 33/52* (2013.01); *H01L 33/62* (2013.01); *H01L 2224/16225* (2013.01); *H01L 2224/73204* (2013.01); *H01L 2924/12041* (2013.01); *H01L 2924/15311* (2013.01); *H01L 2924/181* (2013.01)

(58) Field of Classification Search
CPC .. G09G 3/3258; G09G 3/3283; G09G 3/3291; G09G 3/342; G09G 3/3426
USPC ...................................................... 345/39–48
See application file for complete search history.

(56) References Cited

U.S. PATENT DOCUMENTS

| | | | |
|---|---|---|---|
| 10,566,383 B2* | 2/2020 | Li | H01L 33/62 |
| 2003/0025657 A1* | 2/2003 | Iwafuchi | H01L 25/167 |
| | | | 345/82 |
| 2005/0161771 A1* | 7/2005 | Suehiro | H01L 33/56 |
| | | | 257/612 |
| 2006/0012299 A1* | 1/2006 | Suehiro | H01L 33/20 |
| | | | 313/512 |
| 2006/0214578 A1* | 9/2006 | Iwanaga | C09K 11/7774 |
| | | | 313/512 |
| 2008/0074029 A1* | 3/2008 | Suehiro | H01L 33/501 |
| | | | 313/487 |
| 2008/0142817 A1* | 6/2008 | Ibbetson | H01L 33/62 |
| | | | 257/88 |
| 2009/0224266 A1* | 9/2009 | Wang | F21K 9/00 |
| | | | 257/88 |
| 2011/0031509 A1* | 2/2011 | Kirihara | H01L 24/97 |
| | | | 257/81 |
| 2011/0057553 A1* | 3/2011 | Ogawa | C04B 35/185 |
| | | | 313/116 |
| 2011/0182085 A1* | 7/2011 | Ko | F21K 9/00 |
| | | | 362/612 |
| 2012/0292655 A1* | 11/2012 | Yeh | H01L 33/641 |
| | | | 257/99 |
| 2013/0092960 A1* | 4/2013 | Wilcox | H01L 33/08 |
| | | | 257/88 |
| 2013/0146912 A1* | 6/2013 | Su | H01L 33/641 |
| | | | 257/98 |
| 2013/0285082 A1* | 10/2013 | Bierhuizen | H01L 33/52 |
| | | | 257/88 |
| 2014/0159096 A1* | 6/2014 | Hsia | H01L 24/82 |
| | | | 257/98 |
| 2014/0167077 A1* | 6/2014 | Chen | H01L 25/0753 |
| | | | 257/88 |
| 2015/0245426 A1* | 8/2015 | Liao | F21V 15/01 |
| | | | 362/296.01 |
| 2015/0371585 A1 | 12/2015 | Bower et al. | |
| 2018/0013046 A1* | 1/2018 | Huang | H01L 33/60 |

FOREIGN PATENT DOCUMENTS

| | | |
|---|---|---|
| CN | 102610597 | 7/2012 |
| CN | 104299919 | 1/2015 |
| JP | 2009231440 | 10/2009 |
| JP | 5966412 | 8/2016 |
| TW | 201029123 | 8/2010 |
| TW | 201121108 | 6/2011 |
| TW | 201143166 | 12/2011 |

OTHER PUBLICATIONS

"Office Action of China Counterpart Application", dated Jan. 4, 2021, p. 1-p. 6.

* cited by examiner

LIGHT EMITTING MODULE AND DISPLAY DEVICE

CROSS-REFERENCE TO RELATED APPLICATION

This application claims the priority benefit of Taiwan application serial no. 106122336, filed on Jul. 4, 2017. The entirety of the above-mentioned patent application is hereby incorporated by reference herein and made a part of this specification.

BACKGROUND OF THE INVENTION

1. Field of the Invention

The invention relates to a light emitting module and a display device, and particularly relates to a light emitting module and a display device including microlight emitting diodes.

2. Description of Related Art

With the development of science and technology, electronic products with a thinner thickness have become the current mainstream. Taking display devices as an example, light emitting diodes may be adopted as light sources of light emitting modules of the display devices to pursue a thinner thickness, and the sizes of the light emitting diodes in the light emitting modules have also been shrunk. For example, when a light emitting diode of a light emitting module is electrically bonded to a circuit on a carrier, if the flatness of a bonding site is not desirable, the light emitting diode may not be able to be accurately bonded to the carrier. Thus, the light emitting uniformity and the light emitting efficiency of the light emitting module are affected. As a consequence, the reliability of the light emitting module and the display device may decrease.

SUMMARY OF THE INVENTION

The invention provides a light emitting module and a display device having a flatter circuit to facilitate a yield rate of bonding and light emitting efficiency.

An embodiment of the invention provides a light emitting module including a circuit carrier and a plurality of light emitting devices. The circuit carrier includes a first circuit layer, a second circuit layer, a dielectric layer, and a plurality of conductive vias. The first circuit layer and the second circuit layer are respectively located at two opposite sides of the dielectric layer. The conductive vias pass through the dielectric layer. In addition, two opposite end portions of each of the conductive vias are respectively connected to the first circuit layer and the second circuit layer. The light emitting devices are electrically bonded to the first circuit layer through a plurality of bonding pads. Moreover, the light emitting devices are disposed in a device disposing area of the circuit carrier and the conductive vias are arranged outside the device disposing area.

Another embodiment of the invention provides a display device. The display device includes a substrate and a plurality of the light emitting modules. In addition, the light emitting modules are arranged in an array on the substrate. A distance between two adjacent light emitting devices which respectively belong to any two adjacent light emitting modules in a column direction is identical as ween two adjacent light emitting devices which respectively belong to any two adjacent light emitting modules in a row direction.

According to an embodiment of the invention, an orthogonal projection of each of the light emitting devices on the dielectric layer is not overlapped with any of the conductive vias.

According to an embodiment of the invention, each of the light emitting devices includes a plurality of light emitting components, and the light emitting components include micro light emitting diodes emitting red light, blue light, green light, and ultraviolet light.

According to an embodiment of the invention, a distance between each of the light emitting components and any one of the conductive vias is greater than a length of side of the light emitting component.

According to an embodiment of the invention, the light emitting module further includes a plurality of molding compounds disposed on the circuit carrier. Each of the molding compounds encapsulates the corresponding light emitting device.

According to an embodiment of the invention, the light emitting module further includes a molding compound disposed on the circuit carrier and encapsulating the light emitting devices.

According to an embodiment of the invention, each of the light emitting module further includes a circuit multi-layer, and the circuit carrier is disposed on the circuit multi-layer. In addition, the circuit multi-layer and the first circuit layer are respectively located at two opposite sides of the second circuit layer.

Based on the above, the circuit design of the circuit carrier in the light emitting module according to the embodiments of the invention keeps the parts for bonding with the light emitting devices in the circuit layer of the circuit carrier distant from the conductive vias, thereby providing a preferable flatness. As the parts of the circuit layer for bonding with the light emitting devices have a preferable flatness, the light emitting devices are able to be accurately bonded to the circuit layer without being deviated and oblique.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
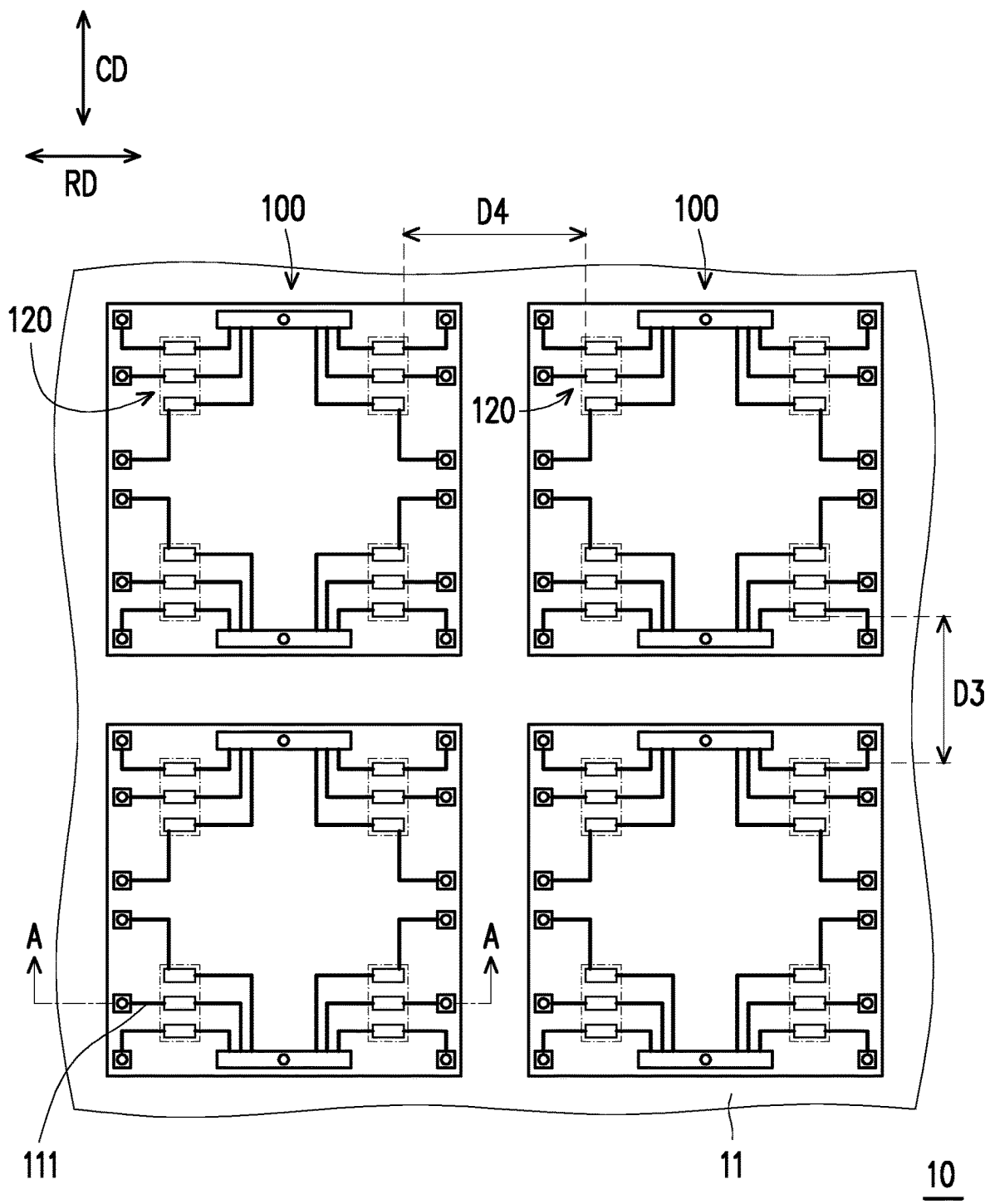
FIG. 1 is a partial schematic top view illustrating a display device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
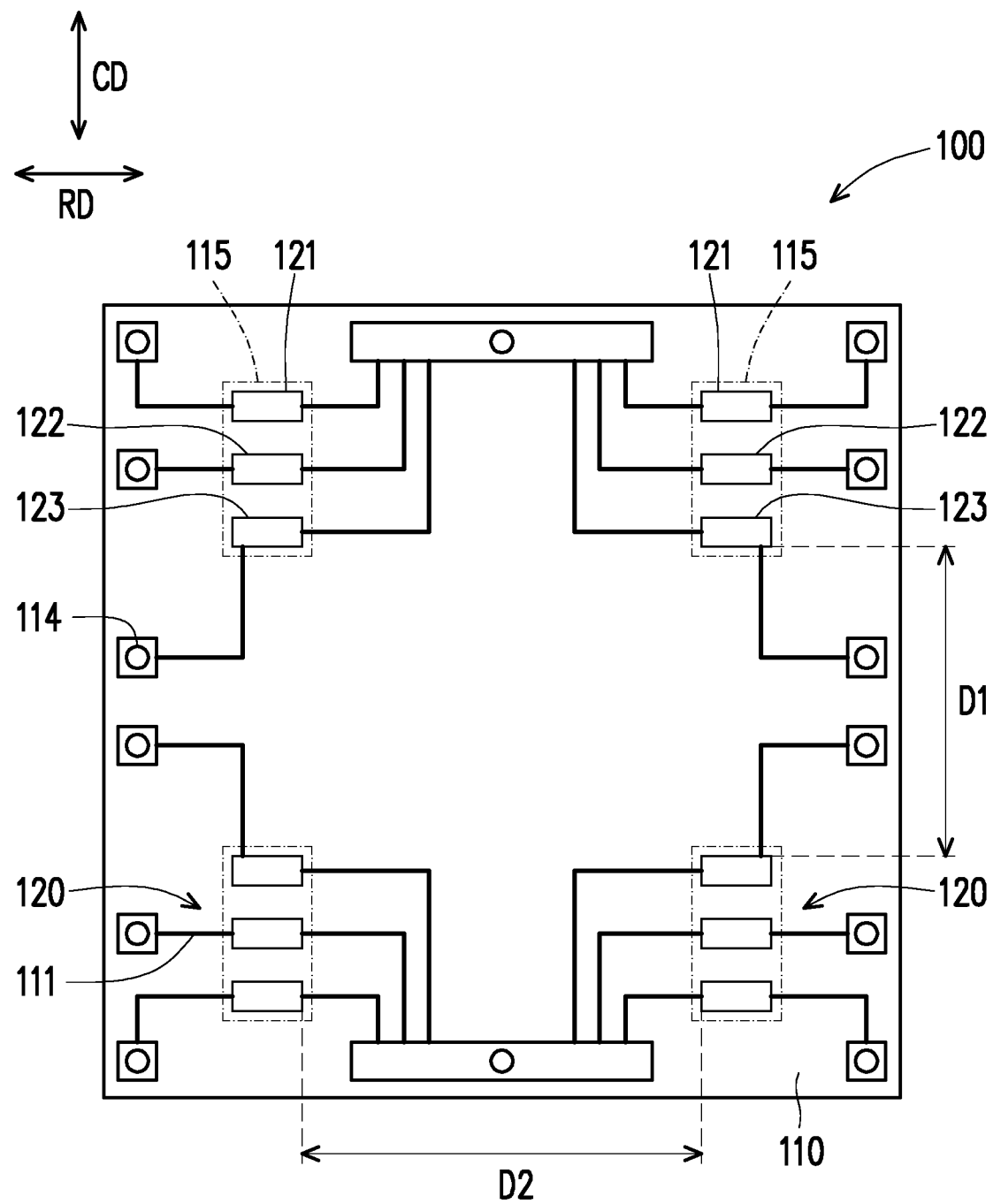
FIG. 2 is a schematic enlarged view illustrating a light emitting module of FIG. 1.
Figure 3:
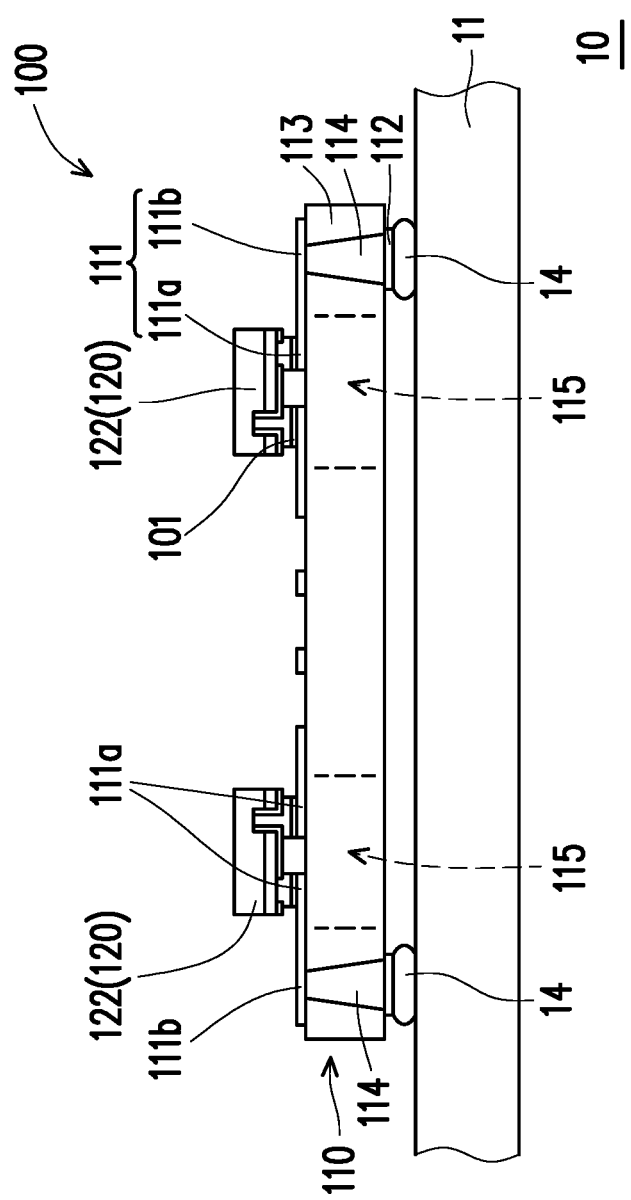
FIG. 3 is a partial schematic cross-sectional view taken along a cross-sectional line A-A of the display device of FIG. 1.

FIG. 1 is a partial schematic top view illustrating a display device according to an embodiment of the invention. FIG. 2 is a schematic enlarged view illustrating a light emitting module of FIG. 1. FIG. 3 is a partial schematic cross-sectional view taken along a cross-sectional line A-A of the display device of FIG. 1. For the ease of description, FIGS. 1 and 2 only schematically illustrate a portion of a first circuit layer 111 and illustrate connection relations with solid dark lines. Referring to FIGS. 1-3, in the embodiment, a display device 10 includes a substrate 11 and a plurality of light emitting modules 100. The substrate 11 may be a printed circuit board (PCB), a glass back plate with thin film transistors (TFTs) or with only conducting lines, a circuit board having an integrated circuit (IC), or other driving substrates having working circuits, for example. In addition, the light emitting modules 100 are arranged in an array on the substrate 11 and electrically connected to the substrate 11. In other embodiments, the substrate 11 may also be a ceramic substrate or a flexible substrate. The invention does not intend to impose a limitation on this regard.

Taking one of the light emitting modules 100 as an example, the light emitting module 100 may include a circuit carrier 110 and a plurality of light emitting devices 120. The circuit carrier 110 includes the first circuit layer 111, a second circuit layer 112, a dielectric layer 113, and a plurality of conductive vias 114. In addition, the first circuit layer 111 and the second circuit layer 112 are respectively located at two opposite sides of the dielectric layer 113. In other words, the first circuit layer 111 is located on an upper surface of the circuit carrier 110, and the second circuit layer 112 is located on a lower surface of the circuit carrier 110. The conductive vias 114 pass through the dielectric layer 113, and two opposite end portions of each of the conductive vias 114 are respectively connected to the first circuit layer 111 and the second circuit layer 112. In the embodiment, the circuit carrier 110 is electrically bonded to the substrate 11 through the second circuit layer 112. The second circuit layer 112 and the substrate 11 may be electrically bonded to each other via pins, conductive bonding pads, bonding bumps, or conductive balls. However, the invention is not limited thereto. In addition, a bonding material 14 for electrical bonding between the second circuit layer 112 and the substrate 11 may include a metal, an alloy, a solder, a conductive polymer, or a conductive oxide. However, the invention is not limited thereto. For example, the circuit carrier 110 may be fixed to the substrate 11 through thermal compressing.

Specifically, the circuit carrier 110 includes a plurality of device disposing areas 115 for disposing the light emitting devices 120. In the embodiment, an example with four device disposing areas 115 is described. However, the invention is not limited thereto. The conductive vias 114 are arranged outside the device disposing areas 115. In addition, the first circuit layer 111 has first circuit parts 111a in the device disposing areas 115 and second circuit parts 111b disposed externally to the device disposing areas 115. The respective conductive vias 114 are connected to the second circuit parts 111b. As shown in FIG. 3, orthogonal projections of the second circuit parts 111b on the dielectric layer 113 are overlapped with the conductive vias 114. Besides, the light emitting devices 120 are disposed in the device disposing areas 115, and are electrically bonded to the first circuit parts 111a through a plurality of bonding pads 101. Since the first circuit parts 111a are distant from the conductive vias 114, the light emitting devices 120 are accurately bonded to the flat first circuit layer 111 without being deviated and oblique. Therefore, the reliability and the light emitting efficiency of the light emitting modules 100 and the display device 10 may be improved, and the light emitting uniformity are facilitated as well.

Referring to FIGS. 2 and 3, in any one of the light emitting modules 100 of the embodiment, the light emitting devices 120 are disposed in the device disposing areas 115, and orthogonal projections of the respective light emitting devices 120 on the dielectric layer 113 are not overlapped with any one of the conductive vias 114. In addition, each of the light emitting devices 120 includes a red light emitting component 121, a green light emitting component 122, and a blue light emitting component 123. In other words, the orthogonal projections of the red light emitting components 121, the green light emitting components 122, and the blue light emitting components 123 are not overlapped with any one of the conductive vias 114. Furthermore, the light emitting devices 120 are flip chip type in the embodiment.

Furthermore, the red light emitting component 121, the green light emitting component 122 and the blue light emitting component 123 may respectively be a micro light emitting diode (micro LED) emitting red light, a micro LED emitting green light, and a micro LED emitting blue light. In the configurations of other embodiments, the light emitting device may further include a light emitting diode that emits ultraviolet light (UV LED). The red light emitting component 121, the green light emitting component 122 and the blue light emitting component 123 of each of the light emitting devices 120 are arranged along a column direction CD. In addition, the number of the light emitting devices 120 in the column direction CD may be two, and the number of the light emitting devices 120 in a row direction RD may be two. However, the invention does not intend to impose a limitation on the number of the light emitting devices in the column direction or the row direction, and how the red light emitting component, the green light emitting component and the blue light emitting component are arranged in each of the light emitting devices is not specifically limited, either. Appropriate adjustment can be made based on practical needs.

In any one of the light emitting modules 100, a distance between two adjacent light emitting devices 120 in the column direction CD is referred to as a distance D1, and a distance between two adjacent light emitting devices 120 in the row direction RD is referred to as a distance D2. In addition, the distance D1 may be equal to the distance D2. More specifically, in the row direction RD, two light emitting components emitting the same color light are adjacent and aligned to each other, and a distance between the two light emitting components emitting the same color light is the distance D2. Furthermore, as shown in FIG. 1, in any two adjacent light emitting modules 100 of the light emitting modules 100, a distance between two adjacent light emitting devices 120 which respectively belong to the two adjacent light emitting modules 100 in the column direction CD is referred to as a distance D3, and a distance between two adjacent light emitting devices 120 in the row direction RD is referred to as a distance D4. In addition, the distance D1 is equal to the distance D3, and the distance D2 is equal to the distance D4. Moreover, an arrangement of the red light emitting component 121, the green light emitting component 122, and the blue light emitting component 123 in the same light emitting device 120 is denser than an arrangement of two adjacent light emitting devices 120. In other words, a distance between the light emitting components in the same light emitting device 120 is shorter than the distance D1 and the distance D2. With the same arrangement parameters of the light emitting devices 120 in any two adjacent light emitting modules 100 of the light emitting modules 100, the light emitting uniformity of the display device 10 is facilitated.

In the embodiment, the conductive vias 114 are arranged outside the device disposing areas 115. In addition, a distance is existed between the red light emitting component 121, the green light emitting component 122, or the blue light emitting component 123 of any one of the light emitting devices 120 and any one of the conductive vias 114. In addition, the distance is at least greater than a maximum length of sides of the red light emitting component 121, the green light emitting component 122, or the blue light emitting component 123. The light emitting components are in a size of a micro LED, and the maximum length of the sides is in a range from 3 μm to 250 μm.

Other embodiments are explicated in the following for further descriptions. It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 4A:
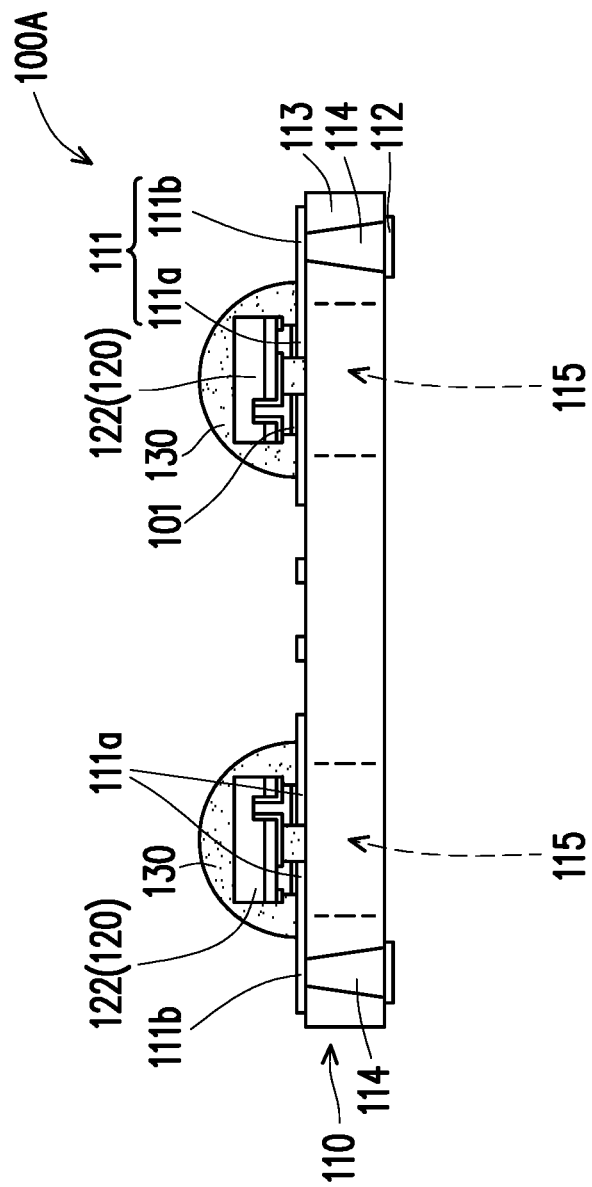
FIG. 4A is a schematic cross-sectional view illustrating a light emitting module according to another embodiment of the invention.

FIG. 4A is a schematic cross-sectional view illustrating a light emitting module according to another embodiment of the invention. A light emitting module 100A of the embodiment is similar to the light emitting module 100 of the previous embodiment, but a main difference therebetween is that each light emitting module 100A further includes a plurality of molding compounds 130, and each of the molding compounds 130 encapsulates one of the light emitting devices 120 to keep moisture or oxygen from the light emitting device 120. As an example, each of the molding compound 130 may be in a semi-spherical shape, so as to facilitate the light emitting uniformity and efficiency of the light emitting module 100A. For example, the light emitting modules 100A may be arranged in an array on the substrate 11 as shown in FIG. 1 or FIG. 3 to form a display device in other configurations of embodiment.

Figure 4B:
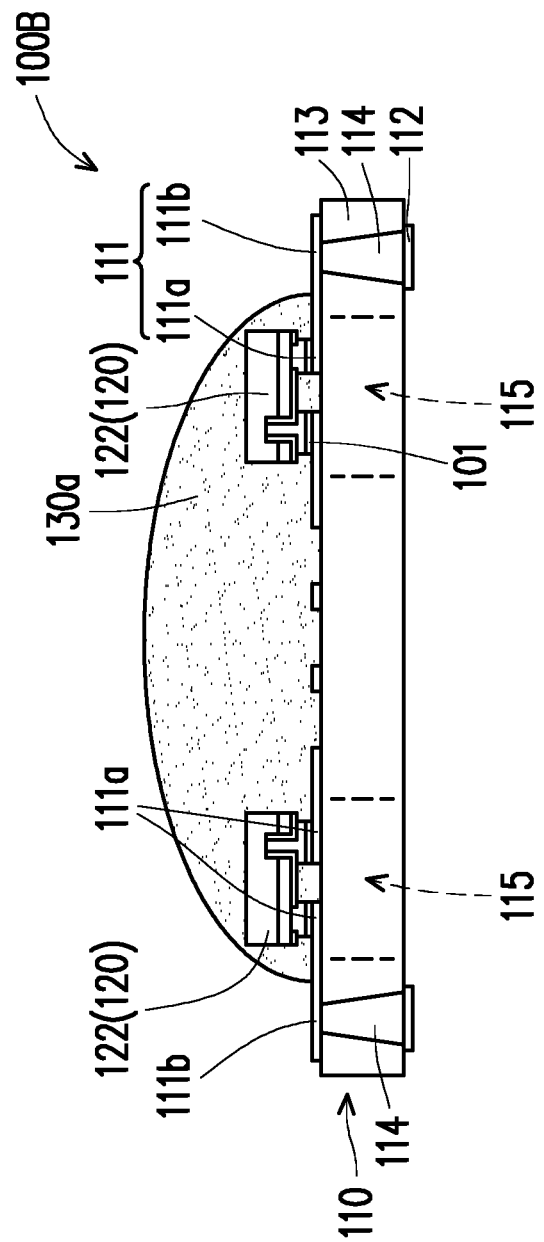
FIG. 4B is a schematic cross-sectional view illustrating a light emitting module according to yet another embodiment of the invention.

FIG. 4B is a schematic cross-sectional view illustrating a light emitting module according to yet another embodiment of the invention. Referring to FIG. 4B, a light emitting module 100B of the embodiment is similar to the light emitting module 100A of FIG. 4A, but a main difference therebetween is that the light emitting devices 120 of the light emitting module 100B are encapsulated by the same molding compound 130a. For example, the light emitting modules 100B may be arranged in an array on the substrate 11 as shown in FIG. 1 or FIG. 3 to form a display device in other configurations of embodiment.

Figure 5:
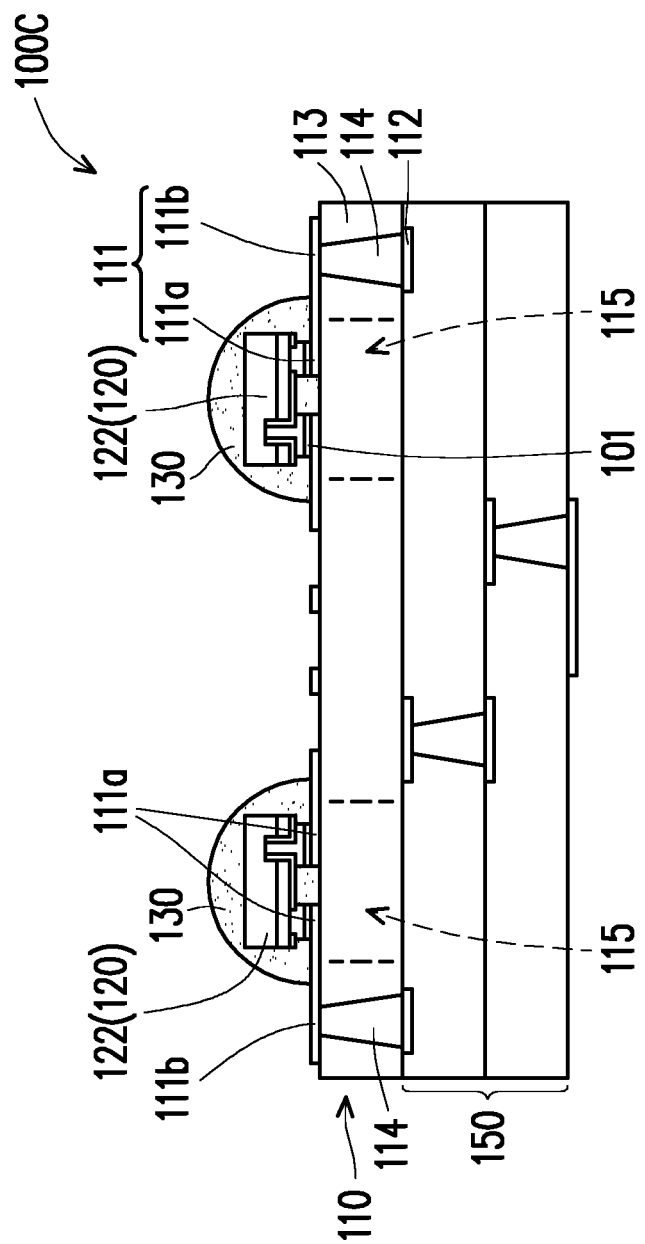
FIG. 5 is a schematic cross-sectional view illustrating a light emitting module according to still another embodiment of the invention.

FIG. 5 is a schematic cross-sectional view illustrating a light emitting module according to still another embodiment of the invention. Referring to FIG. 5, a light emitting module 100C of the embodiment is similar to the light emitting module 100A of FIG. 4A, but a main difference therebetween is that the light emitting module 100C further includes a circuit multi-layer 150. In addition, the circuit carrier 110 is disposed on the circuit multi-layer 150 and electrically connected to the circuit multi-layer 150 through the second circuit layer 112. In addition, the circuit multi-layer 150 and the first circuit layer 111 are respectively located at opposite two sides of the second circuit layer 112.

For example, the light emitting modules 100C may be arranged in an array on the substrate 11 as shown in FIG. 1 or FIG. 3 to form a display device in other configurations of embodiment. Under the circumstance, the substrate 11 may be a flat plate with or without a circuit pattern. It should be noted that the light emitting devices 120 in the light emitting module 100C may be respectively encapsulated by the molding compounds 130. However, in other embodiments, the light emitting devices may be encapsulated by the same molding compound.

As a further example, only one light emitting module 100C may serve to form a display device in other configurations of embodiment. In other words, a large number of the light emitting devices 120 may be mounted to the circuit carrier 110 of the single light emitting module 100C through mass transfer, for example.

Figure 6:
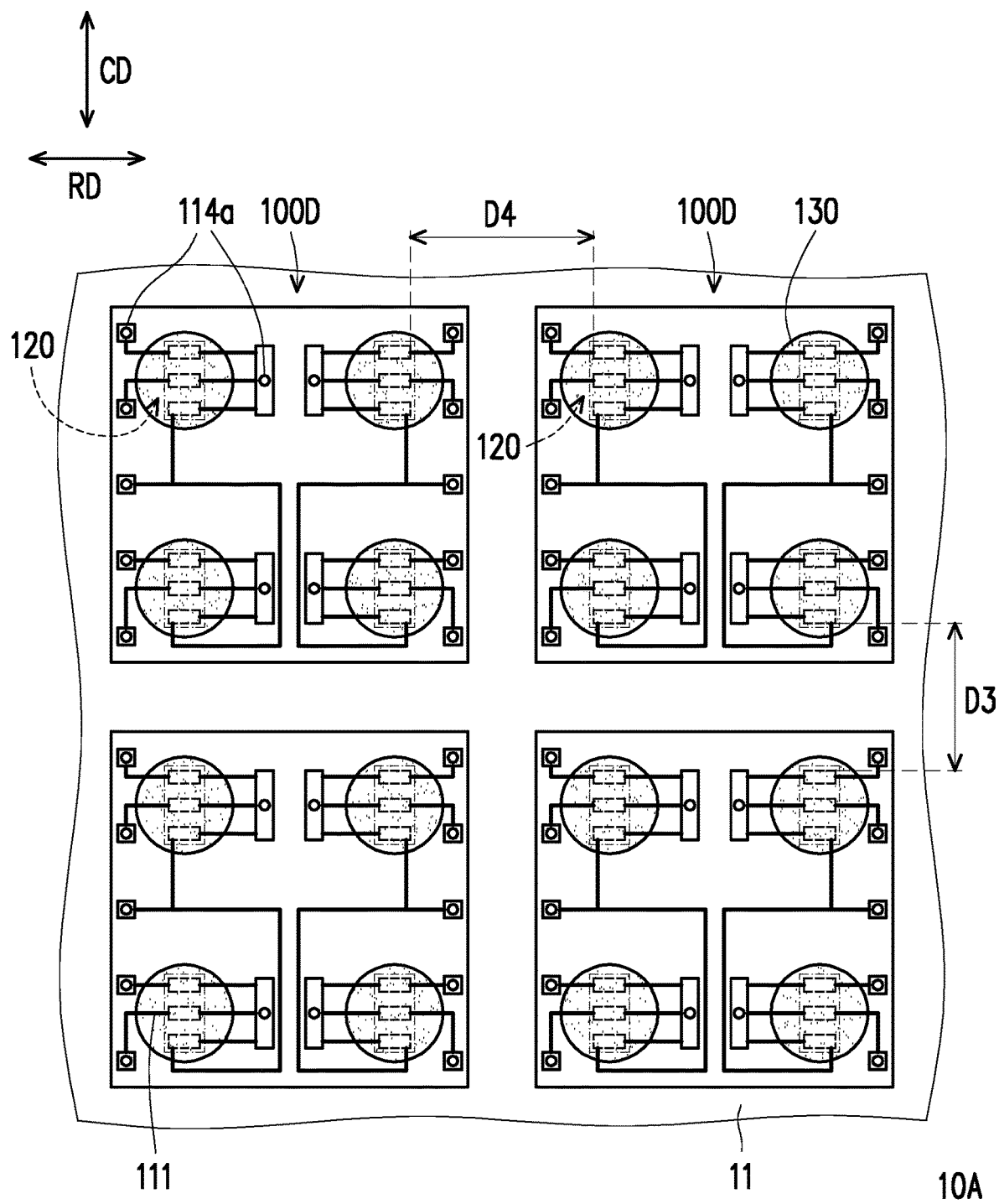
FIG. 6 is a partial schematic top view illustrating a display device according to another embodiment of the invention.

FIG. 6 is a partial schematic top view illustrating a display device according to another embodiment of the invention. Referring to FIG. 6, a display device 10A is similar to the display device 10 of FIG. 1, but a main difference therebetween is that, in one of the light emitting module 100D, a conductive via 114a is configured in the row direction RD between two adjacent light emitting devices 120, and wire layout of the first circuit layer 111 is different. Besides, each of the light emitting modules 100D further includes the molding compounds 130, and each of the molding compounds 130 encapsulates one of the light emitting devices 120 to keep moisture or oxygen from the light emitting device 120. As an example, each of the molding compound 130 may be in a semi-spherical shape, so as to facilitate the light emitting uniformity and the light emitting efficiency of the light emitting module 100D.

In view of the foregoing, the circuit design of the circuit carrier in the light emitting module according to the embodiments of the invention keeps the first circuit parts for bonding the light emitting devices in the first circuit layer of the circuit carrier distant from the conductive vias, thereby providing a preferable flatness. More specifically, the orthogonal projections of the light emitting devices on the dielectric layer are not overlapped with the conductive vias. Thus, the light emitting devices are able to be accurately bonded to the smoother first circuit layer without being deviated and oblique. Consequently, the light emitting module and the display device including the light emitting module according to the embodiments of the invention have better reliability as well as a bonding-process yield. In some of the embodiments, the molding compound or the molding compounds are provided to encapsulate the light emitting devices of the light emitting module, so as to facilitate the light emitting uniformity and the light emitting efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting module, comprising:
a circuit carrier, comprising a first circuit layer, a second circuit layer, a dielectric layer, and a plurality of conductive vias, wherein the first circuit layer and the second circuit layer are respectively located at two opposite sides of the dielectric layer, the plurality of conductive vias pass through the dielectric layer, and two opposite end portions of each of the plurality of conductive vias are respectively connected to the first circuit layer and the second circuit layer; and
a plurality of light emitting devices, electrically bonded to the first circuit layer through a plurality of bonding pads, wherein the plurality of light emitting devices are disposed in a device disposing area of the circuit carrier and the plurality of conductive vias are arranged outside the device disposing area,
an orthogonal projection of each of the plurality of light emitting devices on the dielectric layer is not overlapped with any of the plurality of conductive vias, and
the plurality of bonding pads are located between first circuit parts of the first circuit layer and the plurality of light emitting devices and are electrically connected with the first circuit parts,
wherein each of the plurality of light emitting devices comprises a plurality of light emitting components, and the plurality of light emitting components comprise micro light emitting diodes emitting red light, blue light and green light, and a distance between the plurality of light emitting components in a same light emitting device is shorter than a distance between two adjacent light emitting devices in a column direction,
wherein a distance between one of the plurality of light emitting components and one of the plurality of conductive vias closest to the one of the plurality of light emitting components is greater than a length of a side of the one of the plurality of light emitting components,
two adjacent of the plurality of light emitting devices in the row direction are connected to the same one of the plurality of conductive vias,
in each of the plurality of light emitting devices, the plurality of light emitting components are connected to the same one of the plurality of conductive vias.

2. The light emitting module as claimed in claim 1, further comprising:
a plurality of molding compounds, disposed on the circuit carrier, wherein each of the plurality of molding compounds encapsulates the corresponding light emitting device.

3. The light emitting module as claimed in claim 1, further comprising:
a molding compound, disposed on the circuit carrier and encapsulating the plurality of light emitting devices.

4. The light emitting module as claimed in claim 1, further comprising:
a circuit multi-layer, wherein the circuit carrier is disposed on the circuit multi-layer, and the circuit multi-layer and the first circuit layer are respectively located at two opposite sides of the second circuit layer.

5. The light emitting module as claimed in claim 4, wherein the second circuit layer of the circuit carrier is electrically connected to the circuit multi-layer.

6. A display device, comprising:
a substrate;
a plurality of light emitting modules, arranged in an array on the substrate, wherein each of the plurality of light emitting modules comprises:
a circuit carrier, comprising a first circuit layer, a second circuit layer, a dielectric layer, and a plurality of conductive vias, wherein the first circuit layer and the second circuit layer are respectively located at two opposite sides of the dielectric layer, the plurality of conductive vias pass through the dielectric layer, and two opposite end portions of each of the plurality of conductive vias are respectively connected to the first circuit layer and the second circuit layer; and
a plurality of light emitting devices, electrically bonded to the first circuit layer through a plurality of bonding pads, wherein the plurality of light emitting devices are disposed in a device disposing area of the circuit carrier and the plurality of conductive vias are arranged outside the device disposing area,
an orthogonal projection of each of the plurality of light emitting devices on the dielectric layer is not overlapped with any of the plurality of conductive vias, and
the plurality of bonding pads are located between first circuit parts of the first circuit layer and the plurality of light emitting devices and are electrically connected with the first circuit parts,
wherein each of the plurality of light emitting devices comprises a plurality of light emitting components, and the plurality of light emitting components comprise micro light emitting diodes emitting red light, blue light and green light, and a distance between the plurality of light emitting components in a same light emitting device is shorter than a distance between two adjacent light emitting devices in the column direction,
wherein the distance between two adjacent light emitting devices in the column direction, a distance between two adjacent light emitting devices in a row direction, a distance between two adjacent light emitting devices which respectively belong to any two adjacent light emitting modules in the column direction and a distance between two adjacent light emitting devices which respectively belong to any two adjacent light emitting modules in the row direction are identical,
wherein a distance between one of the plurality of light emitting components and one of the plurality of conductive vias closest to the one of the plurality of light emitting components is greater than a length of a side of the one of the plurality of light emitting components,
two adjacent of the plurality of light emitting devices in the row direction are connected to the same one of the plurality of conductive vias,
in each of the plurality of light emitting devices, the plurality of light emitting components are connected to the same one of the plurality of conductive vias.

7. The display device as claimed in claim 6, wherein each of the plurality of light emitting modules further comprises:
a plurality of molding compounds, disposed on the circuit carrier, wherein each of the plurality of molding compounds encapsulates the corresponding light emitting device.

8. The display device as claimed in claim 6, wherein each of the plurality of light emitting modules further comprises:
a molding compound, disposed on the circuit carrier and encapsulating the plurality of light emitting devices.

9. The display device as claimed in claim 6, wherein each of the plurality of light emitting modules further comprises:
a circuit multi-layer, wherein the circuit carrier is disposed on the circuit multi-layer, and the circuit multi-layer and the first circuit layer are respectively located at two opposite sides of the second circuit layer.

* * * * *